(12) United States Patent
Lee et al.

(10) Patent No.: US 8,525,201 B2
(45) Date of Patent: Sep. 3, 2013

(54) LIGHT EMITTING DEVICE AND METHOD OF MANUFACTURING THE SAME

(75) Inventors: Jae-won Lee, Yongin-si (KR); Bok-ki Min, Suwon-si (KR); Jun-youn Kim, Hwaseong-si (KR); Young-jo Tak, Hwaseong-si (KR); Hyung-su Jeong, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 324 days.

(21) Appl. No.: 12/801,198

(22) Filed: May 27, 2010

(65) Prior Publication Data

US 2011/0127554 A1   Jun. 2, 2011

(30) Foreign Application Priority Data

Dec. 2, 2009 (KR) .................. 10-2009-0118452

(51) Int. Cl.
  *H01L 33/10* (2010.01)
  *H01L 21/00* (2006.01)

(52) U.S. Cl.
  USPC ............................ 257/98; 438/39; 438/42

(58) Field of Classification Search
  USPC ............. 438/29–32, 39–44; 257/79–103
  See application file for complete search history.

(56) References Cited

U.S. PATENT DOCUMENTS

| | | | |
|---|---|---|---|
| 4,990,970 A | 2/1991 | Fuller | |
| 6,376,864 B1 | 4/2002 | Wang | |
| 7,095,062 B2 * | 8/2006 | Linthicum et al. | 257/103 |
| 2003/0143771 A1 * | 7/2003 | Kidoguchi et al. | 438/46 |
| 2003/0213969 A1 * | 11/2003 | Wang et al. | 257/98 |
| 2004/0021147 A1 | 2/2004 | Ishibashi et al. | |
| 2006/0043400 A1 * | 3/2006 | Erchak et al. | 257/98 |
| 2006/0124943 A1 * | 6/2006 | Li et al. | 257/94 |
| 2006/0192217 A1 * | 8/2006 | David et al. | 257/94 |
| 2008/0087909 A1 * | 4/2008 | Weisbuch et al. | 257/98 |
| 2008/0105881 A1 | 5/2008 | Kim et al. | |
| 2008/0251803 A1 | 10/2008 | Cho et al. | |
| 2010/0019268 A1 * | 1/2010 | Illek | 257/99 |
| 2010/0308365 A1 * | 12/2010 | Masuya et al. | 257/98 |

FOREIGN PATENT DOCUMENTS

| | | |
|---|---|---|
| JP | 11-251631 | 9/1999 |
| JP | 2005-057220 | 3/2005 |
| KR | 1020060012806 A | 2/2006 |

(Continued)

OTHER PUBLICATIONS

Chen, et al., "Nitride light-emitting diodes grown on Si (111) using a TiN template," *Appl. Phys. Lett.*, vol. 88, pp. 191110-1-191110-3 (2006).

(Continued)

*Primary Examiner* — Fernando L Toledo
*Assistant Examiner* — Karen Kusumakar
(74) *Attorney, Agent, or Firm* — Harness, Dickey & Pierce, P.L.C.

(57) ABSTRACT

A light emitting device may include a substrate, an n-type clad layer, an active layer, and a p-type clad layer. A concave-convex pattern having a plurality of grooves and a mesa between each of the plurality of grooves may be formed on the substrate, and a reflective layer may be formed on the surfaces of the plurality of grooves or the mesa between each of the plurality of grooves. Therefore, light generated in the active layer may be reflected by the reflective layer, and extracted to an external location.

15 Claims, 12 Drawing Sheets

(56) References Cited

FOREIGN PATENT DOCUMENTS

| KR | 1020070094344 A | 9/2007 |
| KR | 100831843 | 5/2008 |
| KR | 100863804 B1 | 10/2008 |
| KR | 20080093222 | 10/2008 |
| WO | WO2007/124708 * | 11/2007 |
| WO | WO2009099187 * | 8/2009 |

OTHER PUBLICATIONS

Oliver, et al., "Organometallic vapor phase epitaxial growth of GaN on ZrN/AlN/Si substrates," *Appl. Phys. Lett.*, vol. 93, pp. 023109-1-023109-3 (2008).

Roucka, et al., "Structural and optical properties of $ZrB_2$ and $Hf_xZr_{1-x}B_2$ films grown by vicinal surface epitaxy on Si(111) substrates," *Solid State Electronics*, vol. 52, pp. 1687-1690 (2008).

* cited by examiner

FIG. 3G

LIGHT EMITTING DEVICE AND METHOD OF MANUFACTURING THE SAME

CROSS-REFERENCE TO RELATED APPLICATIONS

This application claims priority under U.S.C. §119 to Korean Patent Application No. 10-2009-0118452, filed on Dec. 2, 2009, in the Korean Intellectual Property Office (KIPO), the entire contents of which are incorporated herein by reference.

BACKGROUND

1. Field

Example embodiments relate to methods and apparatuses for manufacturing a light emitting device having improved light emission efficiency.

2. Description of the Related Art

A semiconductor light emitting device generates minority carriers that are injected by using a p-n junction structure of a semiconductor, and emits light by recombination of the minority carriers. The semiconductor light emitting device may be largely divided into a light emitting diode and a laser diode, and the light emitting diode is used as a highly efficient and environmentally-friendly light source in various fields including displays, optical communications, automobiles, and illumination, because the light emitting diode consumes a relatively low amount of power but has relatively high luminosity.

A light emitting device has to have improved light emission performance, and light emission efficiency may be one standard used to determine the light emission performance of the light emitting device. The light emission efficiency is mainly determined by three factors of internal quantum efficiency, extraction efficiency, and an operation voltage. The internal quantum efficiency indicates a characteristic value regarding how many photons are generated with respect to electrons that pass through the light emitting device, and may be determined by a quality of a semiconductor material, and a design of an active region. The extraction efficiency indicates a rate of the amount of photons that partly flow out of a semiconductor chip. The photons that are generated due to a relatively high refractive index difference between the semiconductor and a peripheral material may be absorbed into the semiconductor chip while being internally reflected several times. Thus, the extraction efficiency may be limited by the photons that are lost during the multi-reflection process in the semiconductor chip or during the absorption process. The operation voltage may be determined by an energy band gap of the active region, and electric resistance of the light emitting device.

SUMMARY

Provided are methods and apparatuses for a light emitting device having improved light emission efficiency. Provided are methods and apparatuses for manufacturing a light emitting device of which light emission efficiency is increased. Additional aspects will be set forth in part in the description which follows and, in part, will be apparent from the description, or may be learned by practice of example embodiments.

According to example embodiments, a light emitting device may include a concave-convex pattern on a substrate, the concave-convex pattern having a plurality of grooves and a mesa between each of the plurality of grooves; a first reflective layer on a side surface of each of the plurality of grooves; an n-type clad layer on the concave-convex pattern; an active layer on the n-type clad layer; a p-type clad layer on the active layer; a first electrode on a surface of the substrate; and a second electrode on a surface of the p-type clad layer.

The light emitting device may further include a buffer layer on a top surface of the mesa and the first reflective layer. A space may be between a top portion of each of the plurality of grooves and the n-type clad layer. The light emitting device may further include a second reflective layer on a top surface of the mesa, and a buffer layer on the second reflective layer and a bottom surface of each of the plurality of grooves, respectively.

The n-type clad layer may be grown by using Epitaxial Lateral Over Growth (ELOG). A distance between each of the plurality of grooves may be in the range of about 10 nm to about 100 μm, and a depth of each of the plurality of grooves may be in the range of about 10 nm to about 100 μm. The side surface of each of the plurality of grooves may include an inclined surface. The concave-convex pattern may be formed on a dielectric layer separate from the substrate.

According to example embodiments, a method of manufacturing a light emitting device may include depositing a mask layer on a substrate; forming a concave-convex pattern by using the mask layer, the concave-convex pattern having a plurality of grooves and a mesa between each of the plurality of grooves; depositing a reflective layer on an inner surface of the plurality of grooves and a top surface of the mesa between each of the plurality of grooves; partially exposing the substrate on a bottom surface of the inner surface of the plurality of grooves or on the top surface of the mesa; growing an n-type clad layer on the exposed substrate; forming an active layer on the n-type clad layer; and forming a p-type clad layer on the active layer.

According to example embodiments, a method of manufacturing a light emitting device may include depositing a dielectric layer on a substrate; forming a concave-convex pattern by etching the dielectric layer, the concave-convex pattern having a plurality of grooves and a mesa between each of the plurality of grooves; depositing a reflective layer on an inner surface of the plurality of grooves and a top surface of the mesa between each of the plurality of grooves; etching the substrate so as to partially expose the substrate on a bottom surface of the plurality of grooves; growing an n-type clad layer on the exposed substrate; forming an active layer on the n-type clad layer; and forming a p-type clad layer on the active layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Hereinafter, a light emitting device and a method of manufacturing the same according to example embodiments will be described in detail by explaining example embodiments with reference to the attached drawings. In the drawings, like reference numerals in the drawings denote like elements, and the size of each component may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. In the drawings, the thicknesses of layers and regions are exaggerated for clarity. Like reference numerals in the drawings denote like elements.

Figure 1A:
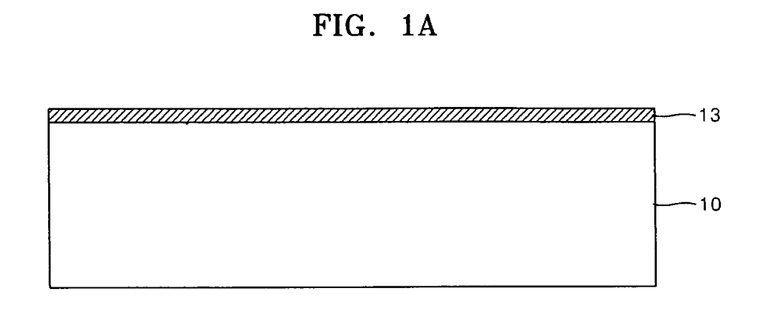
FIGS. 1A through 1G are diagrams for describing a method of manufacturing a light emitting device according to example embodiments.

FIGS. 1A through 1G are diagrams for describing a method of manufacturing a light emitting device according to example embodiments. Referring to FIG. 1A, a mask layer 13 may be deposited on a substrate 10. The mask layer 13 may include a dielectric layer including photoresist and/or silicon nitride (SiNx). The substrate 10 may include a silicon substrate, a gallium nitride (GaN) substrate and/or a gallium oxide ($Ga_2O_3$) substrate. The silicon substrate may include a Si (111) substrate. The mask layer 13 may be deposited after a surface of the substrate 10 is cleaned.

Figure 1B:
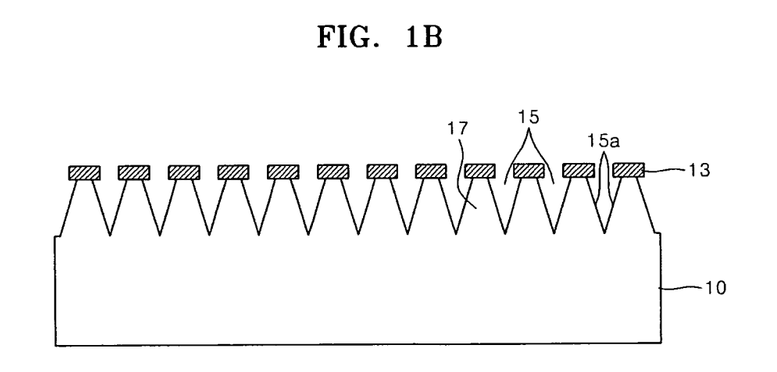

As illustrated in FIG. 1B, the substrate 10 may be etched and patterned by using the mask layer 13. For a patterning operation, a dry etching method may be used. After the patterning operation, a concave-convex pattern having a groove 15 and a mesa 17 may be formed on the substrate 10. A horizontal cross-section of the groove 15 may have a shape selected from the group consisting of a quadrangle, a circle, a polygon, and any combinations thereof. A vertical cross-section of the groove 15 may have various shapes including a U-shape and/or a V-shape.

When the concave-convex pattern is formed, by controlling a dry etching condition, an anisotropic etching by which an etching speed in a horizontal direction may be faster than an etching speed in a vertical direction under the mask layer 13 may be performed so that the groove 15 having inclined side surfaces 15a may be formed. The mesa 17 that is not etched by the mask layer 13 may be formed between a plurality of the grooves 15.

Figure 1C:
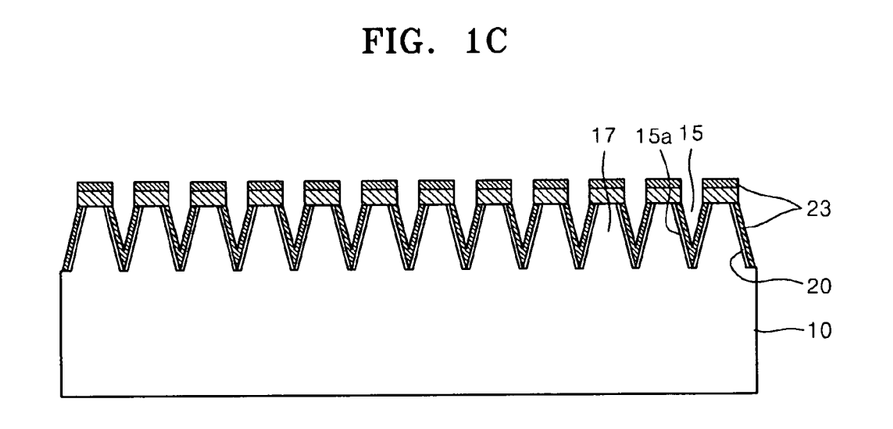

Referring to FIG. 1C, a protective layer 20 and a reflective layer 23 may be deposited on the concave-convex pattern. An interval between each of the neighbouring grooves 15 may be in the range of about 10 nm to about 100 μm, and a depth of the groove 15 may be in the range of about 10 nm to about 100 μm. Where the groove 15 has a nano-scale in the range of about 10 nm to about 1000 nm, and a clad layer to be described later is grown, the clad layer may be grown in a nanorod form or nanowire form. Also, the clad layer may be grown in a bulk form in micro-scale in the range of about 1 μm to about 100 μm. If the clad layer is grown in a nanometer scale, a dislocation density may be decreased so that a structural defect density may be decreased. A size of the groove 15 may be adjusted in consideration of reflectivity, electrical conductivity, resistance, and a horizontal growth distance for Epitaxial Lateral Over Growth (ELOG). An area ratio R where the reflective layer 23 is deposited has to be relatively large in order to increase the reflectivity, while an area ratio 1−R where the reflective layer 23 is not deposited has to be relatively large in order to ensure a current path for reducing the resistance. In order to minimize or reduce the structural defect of an n-type clad layer to be grown on the substrate 10, an area where the n-type clad layer is vertically grown on the substrate 10, that is, the area ratio 1−R where the reflective layer 23 is not deposited, has to be small, but a horizontal growth distance of the n-type clad layer increases as the area ratio R increases such that a growth time taken to generate a continuous thin film may be relatively long, as such a size of a groove pattern may be determined.

In order to increase extraction efficiency of light emitted from an active layer, the reflectivity of the reflective layer 23 to be deposited has to be relatively large. For example, the reflective layer 23 may include a metal layer or a dielectric layer. For example, the metal layer may be formed of at least one selected from the group consisting of silver (Ag), aluminium (Al), gold (Au), titanium (Ti), zirconium diboride ($ZrB_2$), zirconium nitride (ZrN), $Hf_xZr_{(1-z)}B_2$, titanium nitride (TiN), and chromium (Cr). The dielectric layer may include a Distributed Bragg Reflector (DBR). The DBR may be alternately formed of material layers having different refractive indexes. For example, a dielectric DBR may have a structure in which one or more pairs of silicon dioxide ($SiO_2$) and silicon carbide (SiC) are alternately stacked. The reflective layer 23 may be vacuum-deposited by physical vapor deposition (PVD) at room temperature or at a high temperature.

When the reflective layer 23 is deposited, the reflective layer 23 may also be deposited on the side surfaces 15a of the groove 15 by inclining the substrate 10. By doing so, preventing or reducing a loss of the light incident on the side surfaces 15a may be possible. If the reflective layer 23 is not deposited on the side surfaces 15a of the groove 15, the reflectivity of the reflective layer 23 may be changed depending on an incident angle of the incident light, and if re-absorption occurs on a side surface of the substrate 10, where the reflective layer 23 is not deposited on the side surface, the extraction efficiency of light may be decreased. In order to prevent or reduce the loss, and to increase the extraction efficiency of light by enlarging an area of the substrate 10 on which the reflective layer 23 is deposited, the reflective layer 23 may be deposited on the side surfaces 15a of the groove 15.

Figure 1D:
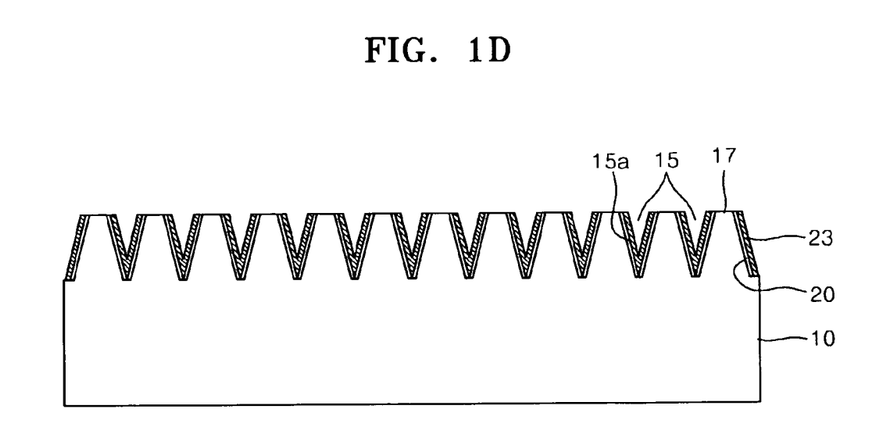

Referring to FIG. 1D, after depositing a protective layer 20 and the reflective layer 23, the mask layer 13 may be removed by etching or by a lift-off method so that the surface of the substrate 10 on which the clad layer is to be grown is exposed. The surface of the substrate 10 on which the clad layer is to be grown may include a region corresponding to the groove 15 or the mesa 17 of the concave-convex pattern. In FIG. 1D, the region of the substrate 10 which corresponds to the mesa 17 of the concave-convex pattern may be exposed.

Figure 1E:
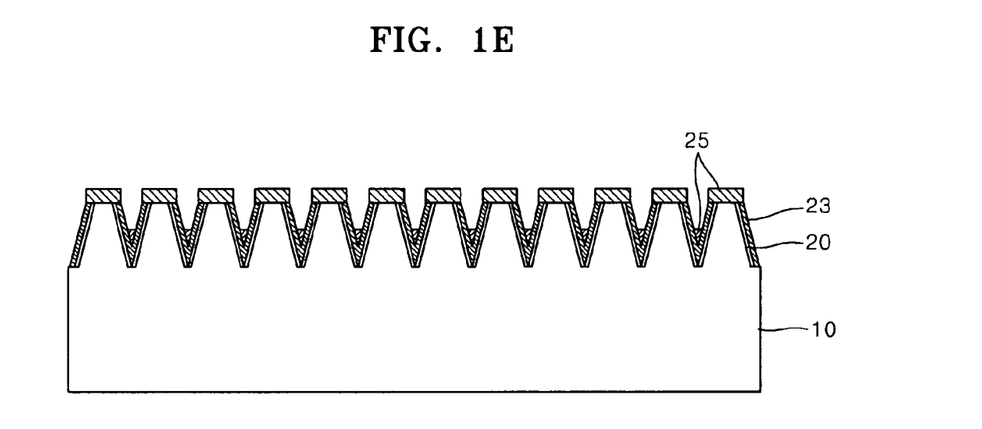

A buffer layer 25 may be deposited on a pattern shown in FIG. 1E. The buffer layer 25 may be deposited to reduce an occurrence of a lattice defect and a crack due to a difference between lattice constants and a difference between thermal expansion coefficients of the substrate 10 and the clad layer to be grown. The buffer layer 25 may include a stress compensating layer or a nucleation layer. For example, the stress compensating layer may be arranged to compensate for a tensile stress that occurs when the clad layer is cooled after the clad layer is grown, and may be formed of a material having a lattice constant less than that of the clad layer so that a compressive stress may be accumulated when the clad layer is grown.

Also, the nucleation layer may be formed of a material having a lattice constant similar to that of the clad layer. For example, the nucleation layer may be formed of an aluminium nitride (AlN) or $Al_xGa_{1-x}N(0 \leq x < 1)$. In addition, by depositing a metallic buffer layer including ZrN or $ZrB_2$ by PVD, a resultant layer thereof may be used as the nucleation layer.

In addition, by arranging the stress compensating layer as such, increasing a growth thickness of a crack-free clad layer may be possible. For example, the stress compensating layer may be formed of a $Al_xGa_{1-x}N$, $Al_xGa_{1-x}N$/GaN superlattice. In order to decrease the lattice defect via gradual adjustment of the lattice constant, the stress compensating layer may be formed in a manner that a composition ratio of AlxGa1-xN is adjusted via a graded manner or a step-wise manner.

In example embodiments, the substrate 10 may include the concave-convex pattern so that reducing an affect may be possible due to the difference between the thermal expansion coefficients, wherein the affect may be directly from the substrate 10 when the clad layer is cooled.

Figure 1F:
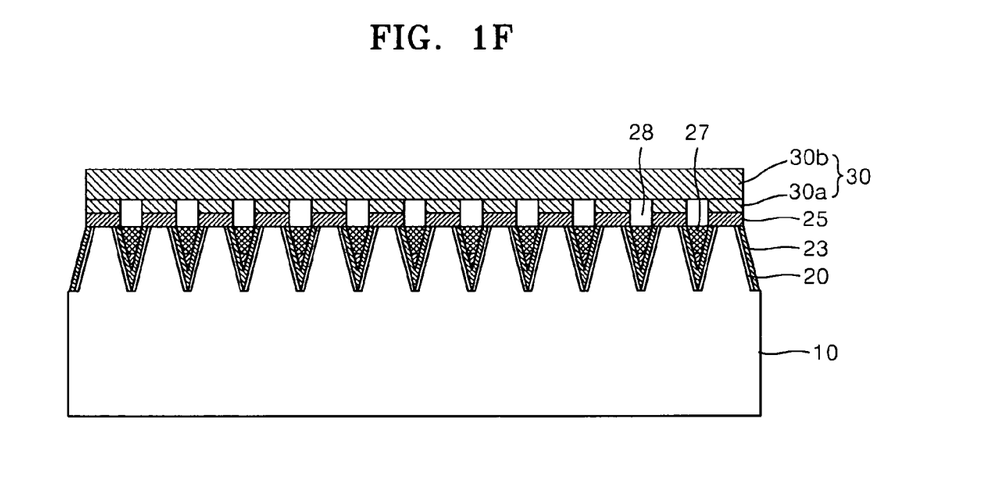

FIG. 1F is a diagram of a growth of an n-type clad layer 30. The n-type clad layer 30 may be grown by using ELOG. The n-type clad layer 30 may include a first n-type clad layer 30a grown in a first direction, and a second n-type clad layer 30b grown in a second direction. In the growth of the n-type clad layer 30, at the beginning, the n-type clad layer 30 may be grown in a vertical direction. After growing the n-type clad layer 30 having a first thickness in the vertical direction, a growing speed in a horizontal direction may be increased by changing a growing condition. The first thickness may be in the range of about several nm to about 1 μm.

When the growing condition is changed from vertical direction growth to horizontal direction growth, a temperature may be increased, a pressure may be decreased, or a source gas flow ratio of a Group V over III may be increased. For example, a ratio of a nitrogen source gas flow to a Ga source gas flow may be increased. By maintaining or changing the growing condition of the horizontal direction growth, allowing the n-type clad layer 30 to have a desired second growth while being grown may be possible. The n-type clad layer 30 may be formed of a nitride semiconductor, e.g., GaN.

When the first n-type clad layer 30a is grown, a clad material, e.g., a nitride, for growing a clad layer in the groove 15 may accumulate in a region corresponding to the groove 15 so that a clad material layer 27 made of the nitride may be formed. Because the reflective layer 23 is stacked on the groove 15, the clad material layer 27 may not grow epitaxially on the groove 15 but may be deposited or may accumulate as a polycrystalline or amorphous phase material. In consideration of this point, the groove 15 may have a micrometer scale depth in proportion to a thickness of the n-type clad layer 30 to be grown. By doing so, preventing or reducing the clad material layer 27, which is to be deposited or accumulated as the polycrystalline or amorphous phase material on the groove 15 during the growth of the n-type clad layer 30, from overflowing out of the groove 15 may be possible, and thus, the growth of the n-type clad layer 30 may be prevented or reduced.

The n-type clad layers 30 that are vertically and horizontally grown in regions corresponding to mesas, respectively, meet on the groove 15. When the n-type clad layers 30 that are grown in the corresponding mesa regions meet, misorientation and dislocation may occur so that horizontal growth may be adjusted to decrease the misorientation and the dislocation. During the growth of the second n-type clad layer 30b, growth does not occur on the clad material layer 27 so that a space 28 may be formed.

In other words, the space 28 may be formed between the groove 15 having the reflective layer 23 and the n-type clad layer 30. By doing so, a contact area between the substrate 10 or the buffer layer 25 and the n-type clad layer 30 may be decreased so that reducing the lattice defect due to the difference between the lattice constants of the substrate 10 or the buffer layer 25 and the n-type clad layer 30 may be possible.

Growing the n-type clad layer 30 on the exposed surface of the substrate 10, without the buffer layer 25, may be possible.

Figure 1G:
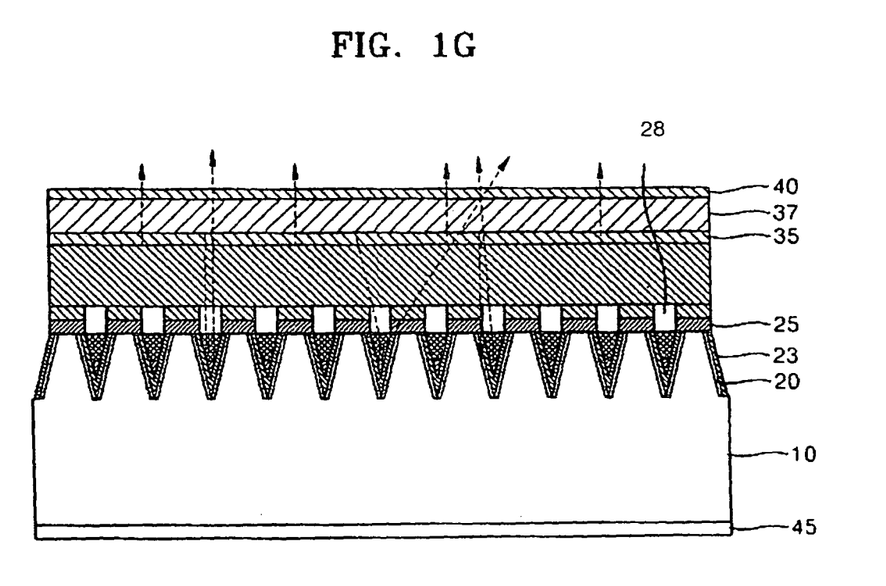

As illustrated in FIG. 1G, after the n-type clad layer 30 is grown, an active layer 35 and a p-type clad layer 37 may be grown. The active layer 35 and the p-type clad layer 37 may be grown by using well known methods. For example, metal organic chemical vapor deposition (MOCVD), hydride vapor phase epitaxy (HVPE), molecular beam epitaxy (MBE), or halide chemical vapor deposition (HCVD) may be used.

The active layer 35 emits light by recombination of electrons-holes, e.g., the active layer 35 may be formed of an indium gallium nitride (InGaN)-based nitride semiconductor layer, and its light emission wavelength may be adjusted by controlling a band gap energy. The active layer 35 includes a quantum well layer and a barrier layer, e.g., the active layer 35 may include the quantum well layer and the barrier layer formed of InGaN/GaN, InGaN/InGaN, InGaN/AlGaN or InGaN/InAlGaN. The quantum well layer may be formed of a single quantum well or a multi-quantum well. The p-type clad layer 37 may be formed of a Group III-V nitride semiconductor material, e.g., a p-type GaN. As a dopant, a p-type dopant including magnesium (Mg), calcium (Ca), zinc (Zn), cadmium (Cd), or mercury (Hg) may be used.

A p-type electrode 40 may be formed on a top surface of the p-type clad layer 37 and an n-type electrode 45 may be formed on a bottom surface of the substrate 10. The p-type electrode 40 and the n-type electrode 45 may be formed of at least one selected from the group consisting of gold (Au), copper (Cu), nickel (Ni), silver (Ag), chromium (Cr), tungsten (W), aluminium (Al), platinum (Pt), tin (Sn), lead (Pb), iron (Fe), titanium (Ti), and molybdenum (Mo), or may be formed of at least one selected from the group consisting of ITO, ZrB, ZnO, InO, and SnO.

The light emitting device according to example embodiments may be a vertical-type light emitting device including the reflective layer 23, and although the substrate 10 is not removed, light that is generated in the active layer 35 is reflected at the reflective layer 23, passes through the p-type clad layer 37, and is extracted. The substrate 10 may include the concave-convex pattern having the groove 15 and the mesa 17, and the reflective layer 23 may be formed on the groove 15 or the mesa 17. The reflective layer 23 may be formed on an inner surface of the groove 15, and, the reflective layer 23 may be formed on the side surfaces 15a of the groove 15.

By depositing the reflective layer 23 on the side surfaces 15a of the groove 15, a reflective area may be relatively large and the light may be reflected regardless of the incident angle of the light so that the light emission efficiency may be increased. In addition, the groove 15 may include inclined side surfaces, and the reflective layer 23 may be deposited on the inclined side surfaces so that the light emission efficiency may be increased.

Figure 2A:
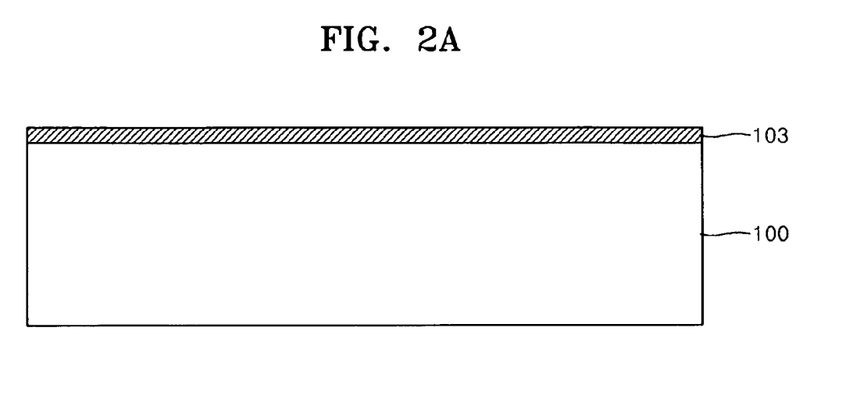
FIGS. 2A through 2G are diagrams for describing a method of manufacturing a light emitting device according to example embodiments.
Figure 2B:
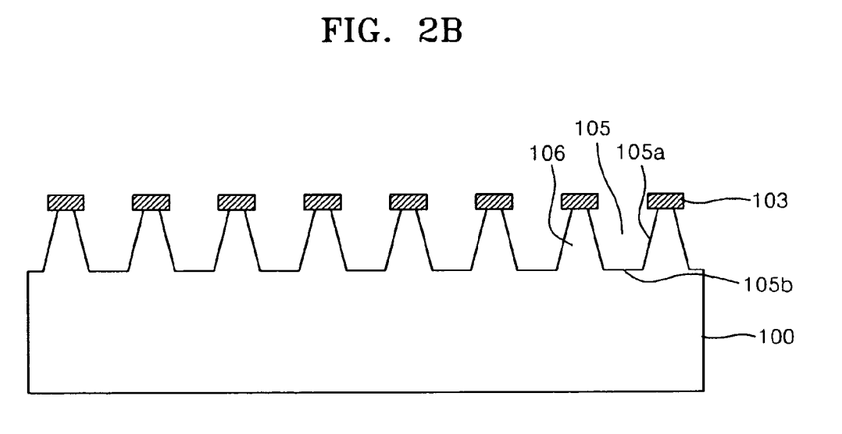

FIGS. 2A through 2G are diagrams for describing a method of manufacturing a light emitting device according to example embodiments. As illustrated in FIG. 2A, after cleaning a surface of a substrate 100, a mask layer 103 may be deposited on the substrate 100. The substrate 100 may include a silicon substrate, a GaN substrate, or a Ga$_2$O$_3$ substrate, and the mask layer 103 may include a dielectric layer or a DBR layer. In the case of the silicon substrate, the silicon substrate may be less expensive than a sapphire substrate or a silicon carbide substrate, and a relatively large diameter wafer may be used in the silicon substrate such that reducing manufacturing costs and increasing productivity may be possible. As illustrated in FIG. 2B, a concave-convex pattern may be formed on the substrate 100 via a dry etching method using the mask layer 103. The concave-convex pattern may include a groove 105 and a mesa 106. The groove 105 may include a side surface 105a and a bottom surface 105b. By performing anisotropic etching in which an etching speed in a horizontal direction is faster than an etching speed in a vertical direction, the concave-convex pattern having inclined side surfaces may be formed. In order to make the bottom surface 105b of the groove 105 have a flat surface so as to grow an n-type clad layer, an etching condition and a size of a pattern may be adjusted.

Figure 2C:
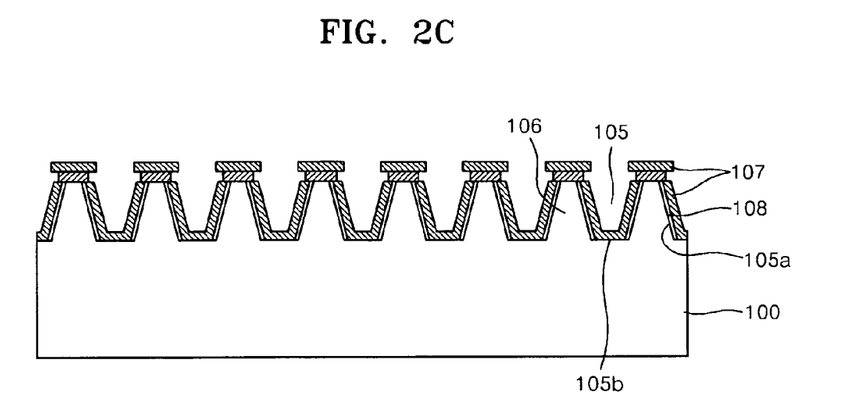

As illustrated in FIG. 2C, a reflective layer 107 may be deposited on the concave-convex pattern. The reflective layer 107 may be deposited, while the substrate 100 is inclined in right and left directions so as to allow the reflective layer 107 to be deposited on the side surface 105a of the groove 105. The reflective layer 107 may include a metal layer having relatively high reflectivity or a DBR layer. Before depositing the reflective layer 107, a protective layer 108 including AlN may be first deposited on the surface of the substrate 100.

Figure 2D:
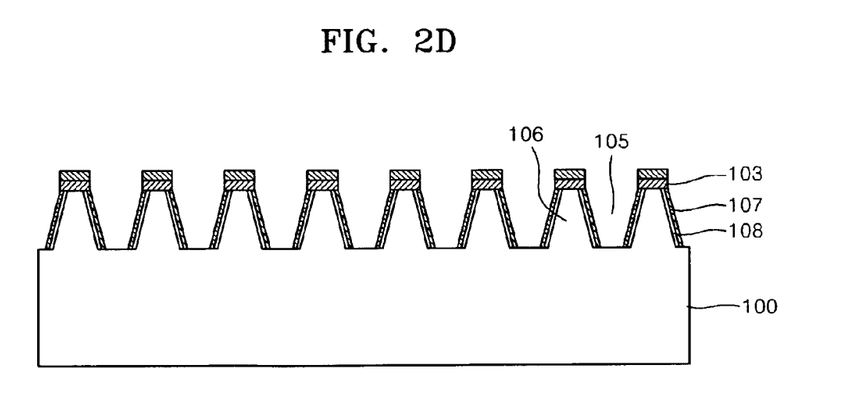
Figure 2E:
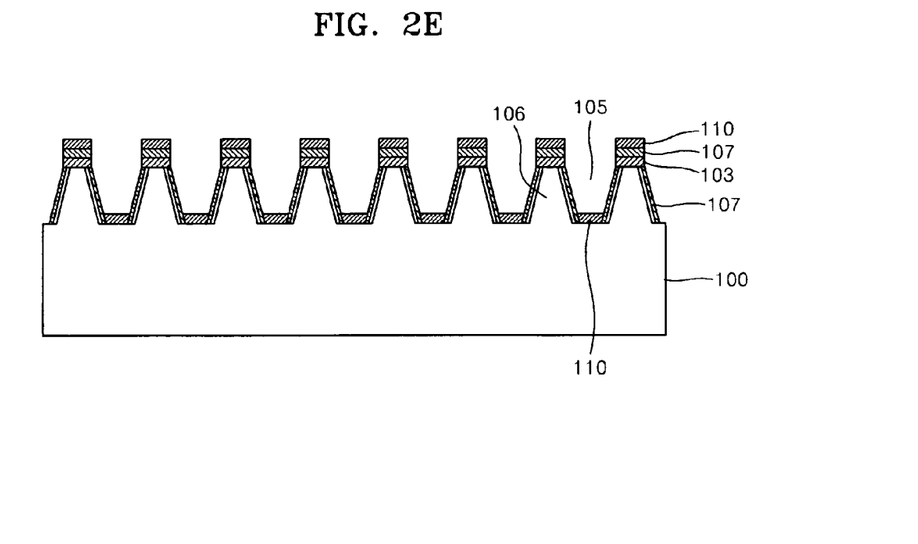

Referring to FIG. 2D, a portion of the substrate 100 corresponding to the bottom surface 105b of the groove 105 may be exposed by performing dry etching. The substrate 100 may be damaged by the dry etching, so the surface of the substrate 100 may be treated by performing wet etching. As illustrated in FIG. 2E, a buffer layer 110 may be deposited on the exposed surface of the substrate 100. The buffer layer 110 performs materially the same function and operation as the buffer layer 25 described in relation to FIG. 1E, and thus, a detailed description thereof will be omitted here.

Figure 2F:
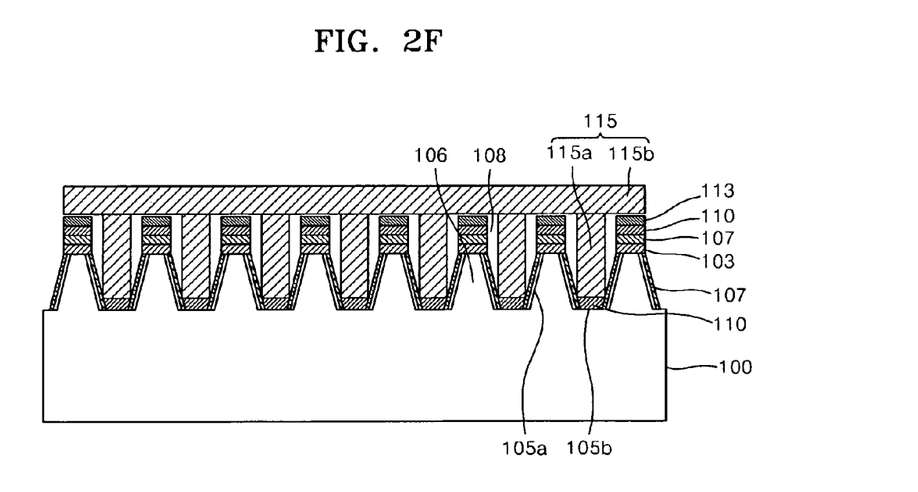

As illustrated in FIG. 2F, an n-type clad layer 115 may be grown on the buffer layer 110. The n-type clad layer 115 may be grown by using ELOG. A first n-type clad layer 115a may be grown in a vertical direction on the buffer layer 110 corresponding to the bottom surface 105b of the groove 105 so as to have a first thickness. When the first n-type clad layer 115a is grown, a clad material layer 113 may be stacked on a region corresponding to the mesa 106. Because the reflective layer 107 is deposited on the mesa 106, a clad material, e.g., a nitride, may not be grown epitaxially on the mesa 106 but may be deposited or may accumulate as a polycrystalline or amorphous phase material.

After the first n-type clad layer 115a is grown, a second n-type clad layer 115b may be grown in a horizontal direction so as to have a second thickness by changing a growing condition to increase a growing speed in the horizontal direction. By maintaining or changing a horizontal growth condition, forming the n-type clad layer 115 having a desired thickness may be possible. The n-type clad layer 115 may be formed of a nitride semiconductor, e.g., GaN.

Figure 2G:
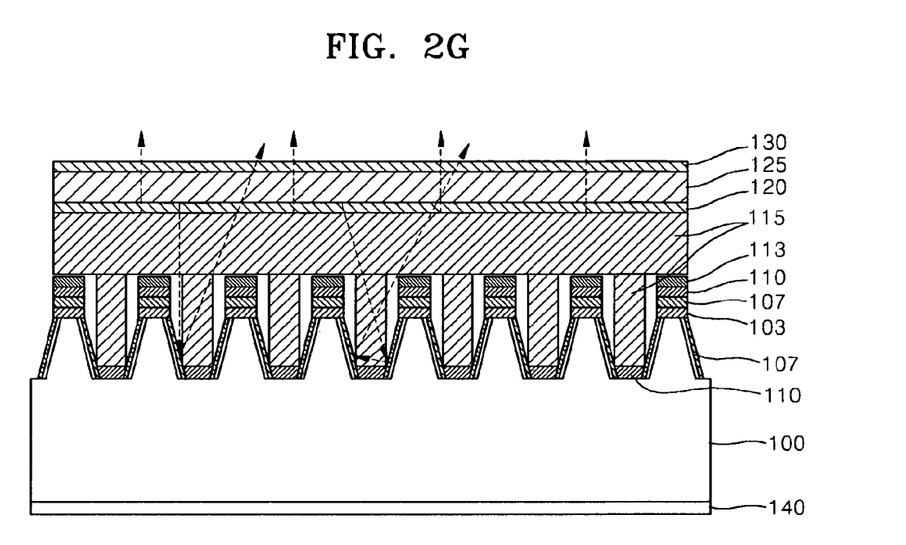

Referring to FIG. 2G, an active layer 120, a p-type clad layer 125, and a p-type electrode 130 may be formed on the n-type clad layer 115. After that, an n-type electrode 140 may be formed on a bottom surface of the substrate 100. The p-type electrode 130 and the n-type electrode 140 may be formed of at least one selected from the group consisting of Au, Cu, Ni, Ag, Cr, W, Al, Pt, Sn, Pb, Fe, Ti, and Mo, or may be formed of at least one selected from the group consisting of ITO, ZrB, ZnO, InO, and SnO.

The light emitting device shown in FIG. 2G includes the substrate 100, the concave-convex pattern having the groove 105 and the mesa 106 formed on the substrate 100, and the reflective layer 107 formed at least on the side surface 105a of the groove 105. In the light emitting device shown in FIG. 2G, the reflective layer 107 may be formed on the side surface 105a of the groove 105 and on a top surface of the mesa 106. The n-type clad layer 115 may be grown on the bottom surface 105b of the groove 105. A space 108 may be formed between the side surface 105a of the groove 105 and the n-type clad layer 115.

Figure 3A:
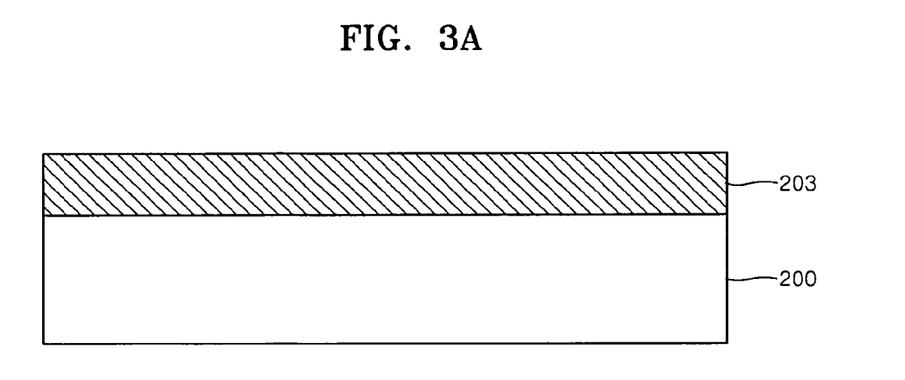
FIGS. 3A through 3G are diagrams for describing a method of manufacturing a light emitting device according to example embodiments.

FIGS. 3A through 3G are diagrams for describing a method of manufacturing a light emitting device according to example embodiments. Referring to FIG. 3A, after cleaning a surface of a substrate 200, a dielectric layer 203 may be deposited on the substrate 200. The dielectric layer 203 may be formed of $SiO_2$.

Figure 3B:
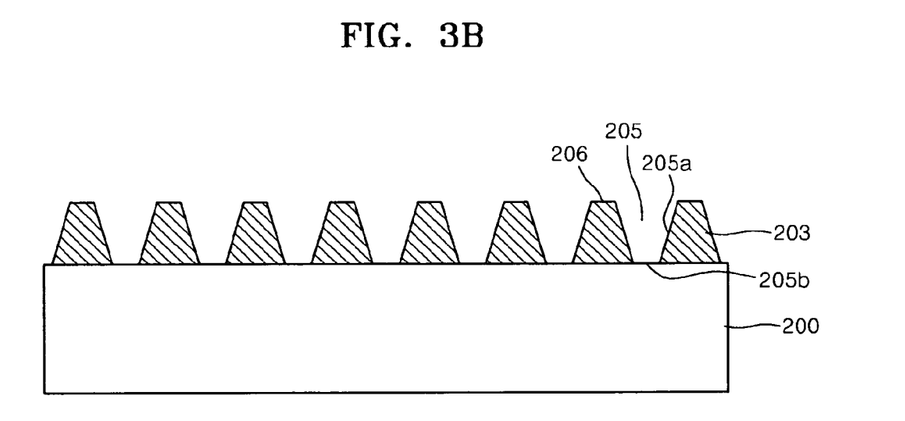

As illustrated in FIG. 3B, a concave-convex pattern may be formed on the dielectric layer 203 by performing etching. The concave-convex pattern may include a groove 205 and a mesa 206. The groove 205 may include a side surface 205a and a bottom surface 205b. The bottom surface 205b may be formed by exposing the substrate 200.

Figure 3C:
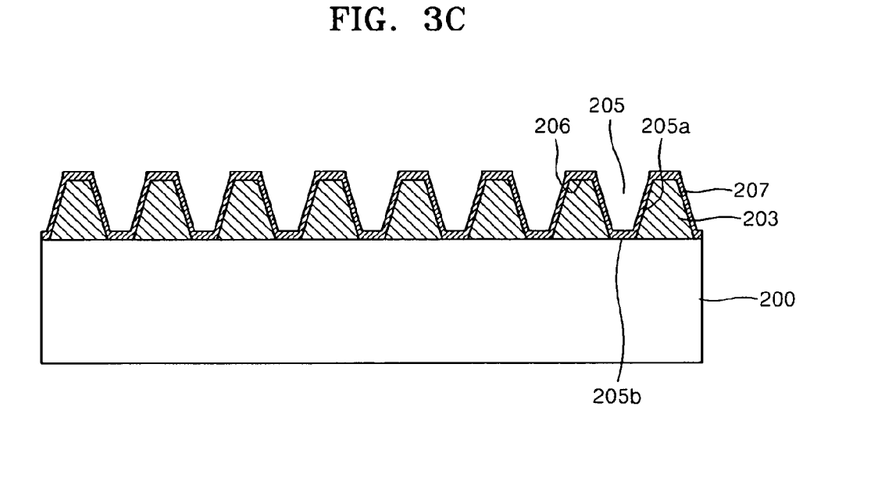
Figure 3D:
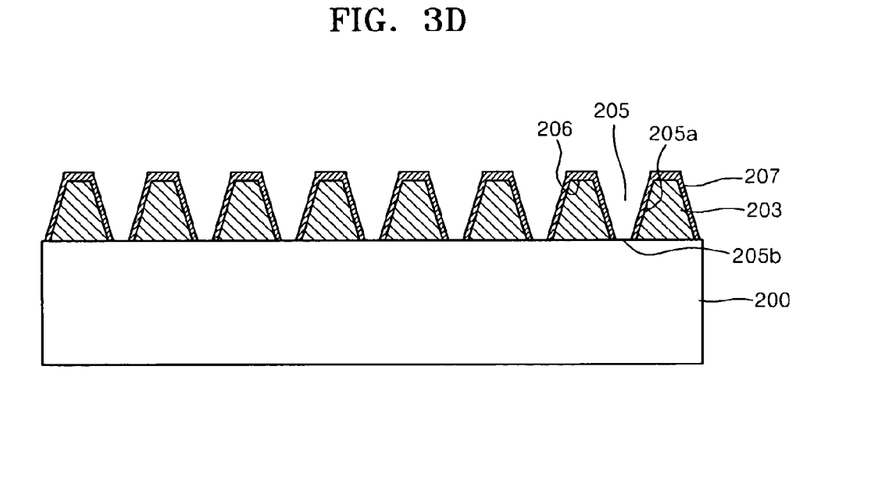
Figure 3E:
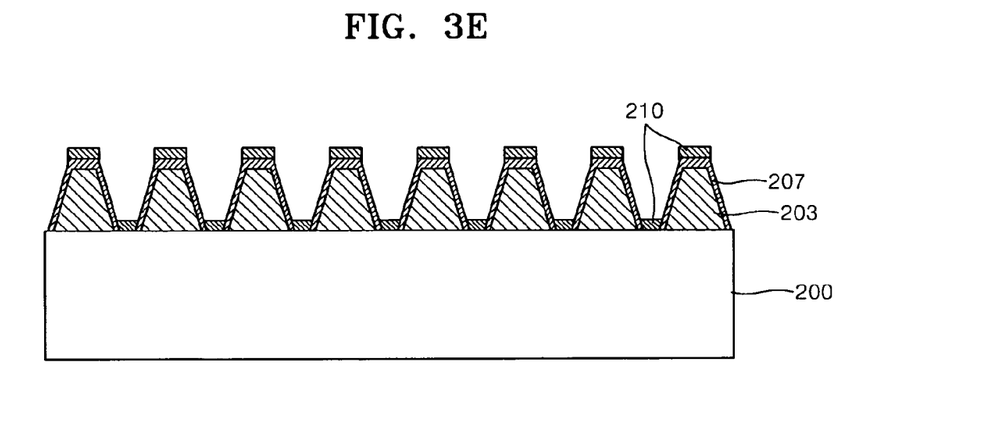

As illustrated in FIG. 3C, a reflective layer 207 may be deposited on the concave-convex pattern. When the reflective layer 207 is deposited, the substrate 200 may be inclined in right and left directions so as to allow the reflective layer 207 to be deposited on the side surface 205a. The reflective layer 207 may include a metal layer or a DBR. As illustrated in FIG. 3D, a portion of the substrate 200 corresponding to the bottom surface 205b of the groove 205 may be exposed by performing dry etching. Referring to FIG. 3E, a buffer layer 210 may be deposited on a pattern shown in FIG. 3D.

Figure 3F:
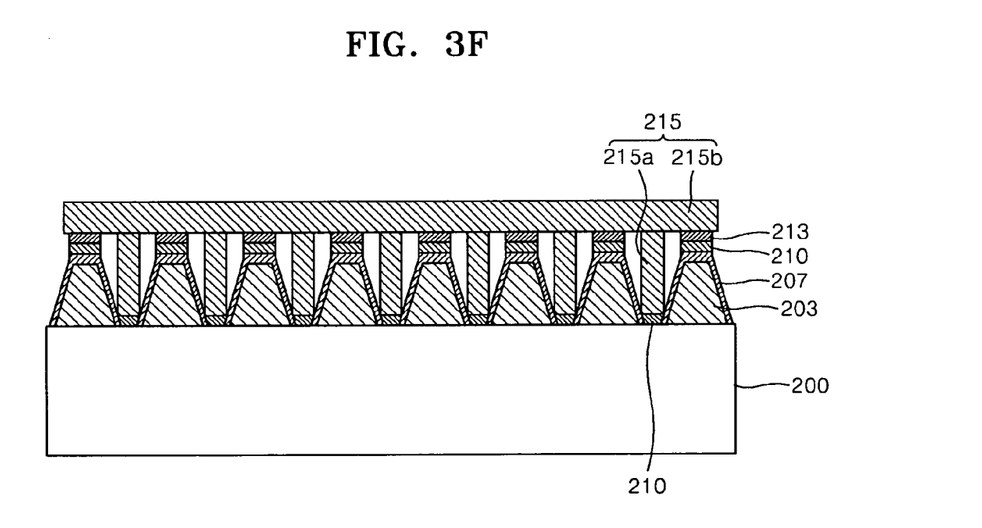

As illustrated in FIG. 3F, an n-type clad layer 215 may be grown on the buffer layer 210. The n-type clad layer 215 may be grown by using ELOG. A first n-type clad layer 215a may be grown epitaxially in a vertical direction on the buffer layer 210 in the bottom surface 205b of the groove 205 so as to have a first thickness. Because the reflective layer 207 is formed on a top surface of the mesa 206, a clad material layer 213 may not be grown epitaxially on the top surface of the mesa 206a but may accumulate as a polycrystalline or amorphous phase material. After a growth of the first n-type clad layer 215a, a second n-type clad layer 215b may be grown in a horizontal direction so as to have a second thickness by changing a growing condition by increasing a growing speed in the horizontal direction.

Figure 3G:
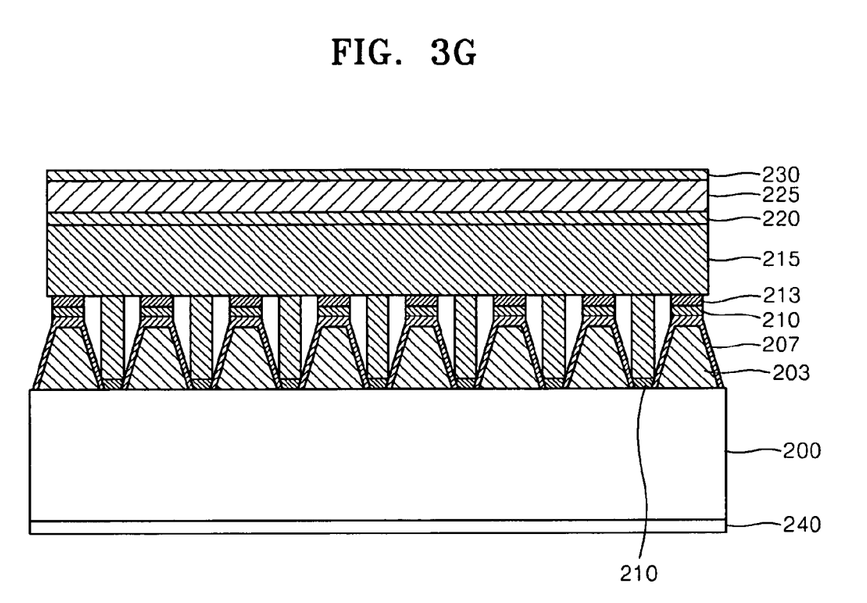

As illustrated in FIG. 3G, an active layer 220, a p-type clad layer 225, and a p-type electrode 230 may be formed on the n-type clad layer 215. After that, an n-type electrode 240 may be formed on a bottom surface of the substrate 200.

The light emitting device shown in FIG. 3G includes the substrate 200, the dielectric layer 203 stacked on the substrate 200, and the concave-convex pattern having the groove 205 and the mesa 206 arranged on the dielectric layer 203. Compared to the light emitting device shown in FIG. 2G, the light emitting device shown in FIG. 3G is different in that the concave-convex pattern may be arranged in the dielectric layer 203 that is arranged as a separate body different from the substrate 200.

As described above, the light emitting device according to example embodiments may include a reflecting layer embedded pattern so as to increase the extraction efficiency of the light, so that the light emission efficiency may be increased. Also, the light emitting device includes a relatively large area of the reflective layer that reflects the light emitted from the active layer and thus allows the light to be emitted to an external location.

The light emitting device according to example embodiments may include the concave-convex pattern having the groove and the mesa which are formed on the substrate or the dielectric layer, and includes the reflective layer formed at least on the side surface of the groove, so that the light emitting device may reduce light being generated in the active layer from being absorbed by the substrate, and thus may increase the light emission efficiency. Also, by decreasing the amount of light absorbed by the substrate via the reflective layer, the substrate may not be removed so that a substrate removal process may be omitted.

It should be understood that example embodiments described herein should be considered in a descriptive sense only and not for purposes of limitation. Descriptions of features or aspects within each embodiment should typically be considered as available for other similar features or aspects in other example embodiments.

What is claimed is:

1. A light emitting device comprising:
   a concave-convex pattern on a substrate, the concave-convex pattern including a plurality of grooves and a mesa between each of the plurality of grooves;
   a first reflective layer on a side surface of each of the plurality of grooves, the first reflective layer exposing a top surface of the mesa of the concave-convex pattern;
   an n-type clad layer on the concave-convex pattern, the n-type clad layer being in contact with the top surface of the mesa of the concave-convex pattern;
   an active layer on the n-type clad layer;
   a p-type clad layer on the active layer;
   a first electrode on a surface of the substrate, the first electrode facing the first reflective layer with the substrate therebetween; and
   a second electrode on a surface of the p-type clad layer.

2. The light emitting device of claim 1, further comprising:
   a buffer layer on a top surface of the mesa and the first reflective layer.

3. The light emitting device of claim 2, further comprising:
   a space between a top portion of each of the plurality of grooves and the n-type clad layer.

4. The light emitting device of claim 1, further comprising:
   a second reflective layer on a top surface of the mesa; and
   a buffer layer on the second reflective layer and a bottom surface of each of the plurality of grooves.

5. The light emitting device of claim 1, wherein the n-type clad layer is grown by using Epitaxial Lateral Over Growth (ELOG).

6. The light emitting device of claim 1, wherein the first reflective layer includes a metal layer or a dielectric layer.

7. The light emitting device of claim 6, wherein the metal layer includes at least a material selected from the group consisting of silver (Ag), aluminium (Al), gold (Au), titanium (Ti), zirconium diboride ($ZrB_2$), zirconium nitride (ZrN), $Hf_xZr_{(1-z)}B_2$, titanium nitride (TiN), and chromium (Cr).

8. The light emitting device of claim 6, wherein the dielectric layer includes a Distributed Bragg Reflector (DBR) layer.

9. The light emitting device of claim 1, wherein a distance between each of the plurality of grooves is in the range of about 10 nm to about 100 μm, and a depth of each of the plurality of grooves is in the range of about 10 nm to about 100 μm.

10. The light emitting device of claim 1, wherein the side surface of each of the plurality of grooves includes an inclined surface.

11. The light emitting device of claim 1, wherein each of the plurality of grooves includes a V-shaped cross-section.

12. The light emitting device of claim 1, wherein the concave-convex pattern is formed on a dielectric layer separate from the substrate.

13. The light emitting device of claim 12, further comprising:
   a second reflective layer on a top surface of the mesa; and
   a buffer layer on the second reflective layer and a bottom surface of each of the plurality of grooves.

14. The light emitting device of claim 12, wherein the n-type clad layer is grown by using ELOG.

15. The light emitting device of claim 12, further comprising:
- a space between the first reflective layer and the n-type clad layer.

* * * * *